(12) United States Patent
Chang et al.

(10) Patent No.: US 9,171,920 B2
(45) Date of Patent: Oct. 27, 2015

(54) GATE STRUCTURE

(71) Applicant: National Chiao Tung University, Hsinchu (TW)

(72) Inventors: Yi Chang, Hsinchu (TW); Chien-I Kuo, Hsinchu (TW); Heng-Tung Hsu, Chung-Li (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 0 days.

(21) Appl. No.: 14/180,714

(22) Filed: Feb. 14, 2014

(65) Prior Publication Data

US 2015/0236109 A1  Aug. 20, 2015

(51) Int. Cl.
*H01L 29/423* (2006.01)
*H01L 29/778* (2006.01)
*H01L 29/66* (2006.01)
*H01L 21/285* (2006.01)
*H01L 21/28* (2006.01)

(52) U.S. Cl.
CPC .......... *H01L 29/42316* (2013.01); *H01L 21/28* (2013.01); *H01L 21/28587* (2013.01); *H01L 29/4232* (2013.01); *H01L 29/66431* (2013.01); *H01L 29/778* (2013.01)

(58) Field of Classification Search
CPC . H01L 21/28; H01L 21/2814; H01L 29/4232; H01L 29/66431; H01L 29/778
USPC .......................................... 438/182, 574, 579
See application file for complete search history.

(56) References Cited

PUBLICATIONS

Yoshida et al ["Impact of T-gate Stem height on Parasitic Gate Delay Time in InGaAs HEMTs", Research Institute of Electrical Communication, 2013, pp. 115-118].*
Edward-Yi Chang et al., "InAs Thin-Channel High-Electron-Mobility Transistors with Very High Current-Gain Cutoff Frequency for Emerging Submillimeter-Wave Applications", Applied Physics Express, Feb. 18, 2013, vol. 6, pp. 1-3.

* cited by examiner

*Primary Examiner* — Thanhha Pham
(74) *Attorney, Agent, or Firm* — Bacon & Thomas, PLLC

(57) ABSTRACT

The present invention discloses a gate structure, which is applied for an electronic component comprising a substrate and an active region defined thereon, and such the gate structure is disposed in the active region and is a T-shaped gate having a stem with a height of 250 nm. Preferably, the gate structure has a gate length of 60 nm.

2 Claims, 8 Drawing Sheets

GATE STRUCTURE

BACKGROUND OF THE INVENTION

1. Field of the Invention

This invention relates to a gate structure and, more particularly, to a T-shaped gate structure with high stem and low parasitic.

2. Description of the Prior Art

In circuits for high frequency applications, the unwanted series resistance and capacitance across the input terminals of a device must be reduced. To reduce the series resistance, the cross section of the gate metal should be maintained even when its length is reduced for short channel devices. To reduce the capacitance, the lateral areas of the gate electrode facing the source and drain should be minimized. This is achieved by adopting a two sections gate electrode structure 1 as depicted in FIG. 1, which shows a simplified schematic diagram of a high electron mobility transistor (HEMI) 1 having a substrate 11, a channel layer 12, a source 13, a drain 14 and a gate 15. The gate 15 has a head portion 151 and a stem portion 152, the dimension of the stem portion of the gate contacting the channel layer is defined as the gate length or channel length L2 which is made close to 100 nm in prior art for achieving high frequency performance. Whereas the head portion length L1 is made substantially larger than the gate length L2 to reduce the resistance of the gate in the direction of perpendicular to the direction of channel length and parallel to the surface of the substrate. Such a gate with the head portion substantially longer than that of the stem portion is often called a T-gate.

In addition to the abovementioned HEMT, which is a variant of gallium arsenide field effect transistor technology and where input signals are applied between the gate and source, such the T-gates also have been advantageously applied to metal semiconductor field effect transistors ("MESFETs") and both of the above two are mainly used in satellite broadcasting receivers, high speed logic circuits and power modules. The narrow base of a T-gate structure provides a short channel length which results in increased speed and decreased power consumption. Parasitic resistances and capacitances that limit device speed are also reduced. The top portion of a T-gate is made wide so that the conductance of the T-gate remains high, for example, for high switching speeds.

In general, an Electron-beam ("E-beam") lithography method is the most commonly used to fabricate a T-gate and does not limit to use a double or triple photoresist layer. FIG. 2A, FIG. 2B, FIG. 2C to FIG. 2D are diagrams showing a conventional process for forming a T-gate using e-beam. Typically, from FIG. 2A shown, substrate 21 is coated with a layer of first poly(methyl methacrylate)-based photoresist 22, a layer of second poly(methyl methacrylate)-based photoresist 23, and a layer of third poly(methyl methacrylate)-based photoresist 24. As shown in FIG. 2B, Photoresist layers 22 to 24 are then exposed to e-beam and developed to provide a patterned photoresist stack having generally T-shaped profile 25. FIG. 2C shows a layer of a conductive material 26 is then deposited on the entire surface inclusive of the surface of substrate 21 exposed by the patterning of the photoresist layers. Photoresist layers 22 to 24 are then removed, lifting-off the conductive material layer on the surface of photoresist layer 24 in the process, to provide T-gate structure 27 on substrate 21 as shown in FIG. 2D.

Accordingly, the thin photoresist will be used for small gate length to obtain fine pattern so that a T-gate with low stem is obtained. In addition, a complete gate technique, such as a sub-50 nm two-step recess, is performed to avoid the T-gate from collapsing and further to obtain high performance transistor. However, the abovementioned method is too complete for mass production and also limits the applications in sub-millimeter wave or THz monolithic microwave integrated circuit (MMIC).

SUMMARY OF THE INVENTION

Accordingly, it is an object of the present invention to provide a gate structure, which is applied for an electronic component comprising a substrate and an active region defined thereon, and the gate structure is disposed in the active region and is a T-shaped gate having a stem with a height of 250 nm.

Preferably, the gate structure has a gate length of 60 nm.

Preferably, the substrate is a gallium arsenide (GaAs) substrate or an indium phosphorous (InP) substrate.

Preferably, the gate structure is formed by the following steps: Firstly, a substrate is provided, and a layer of a first photoresist is formed on the substrate and thickened. A layer of a second photoresist and a layer of a third photoresist are formed in order on the layer of the first photoresist. And then, the layer of the first photoresist, the layer of the second photoresist and the layer of the third photoresist are patterned to form a recess. A step of depositing a conductive material in the recess is followed, and the layer of the first photoresist, the layer of the second photoresist and the layer of the third photoresist are removed. Preferably, the step of forming and thickening the layer of the first photoresist is performed by reducing a rotation rate of a spin coating process. Preferably, the distance between the stem of the gate structure and the sidewall of the recess is 70 nm. Preferably, the step of patterning the layer of the first photoresist, the layer of the second photoresist and the layer of the third photoresist to form the recess is performed by an electron-beam lithography method.

The features and advantages of the present invention will be understood and illustrated in the following specification and figures.

DESCRIPTION OF THE PREFERRED EMBODIMENT

Figure 3:
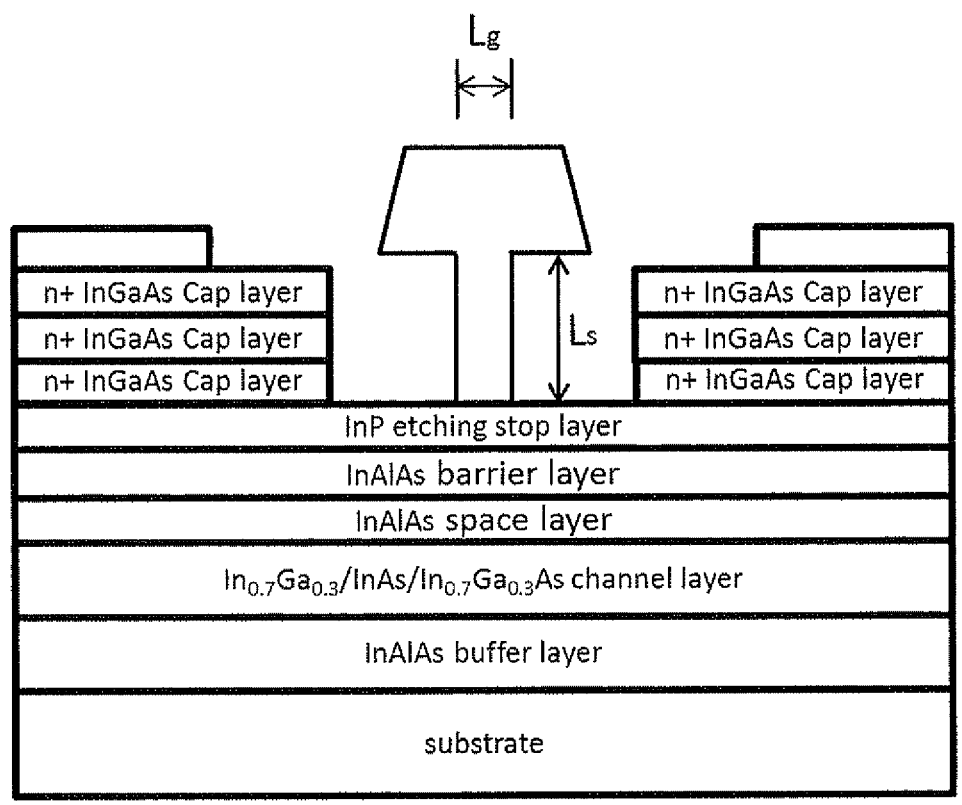
FIG. 3 is a schematic view showing a HEMT structure with a gate structure according to the present invention.
Figure 4A:
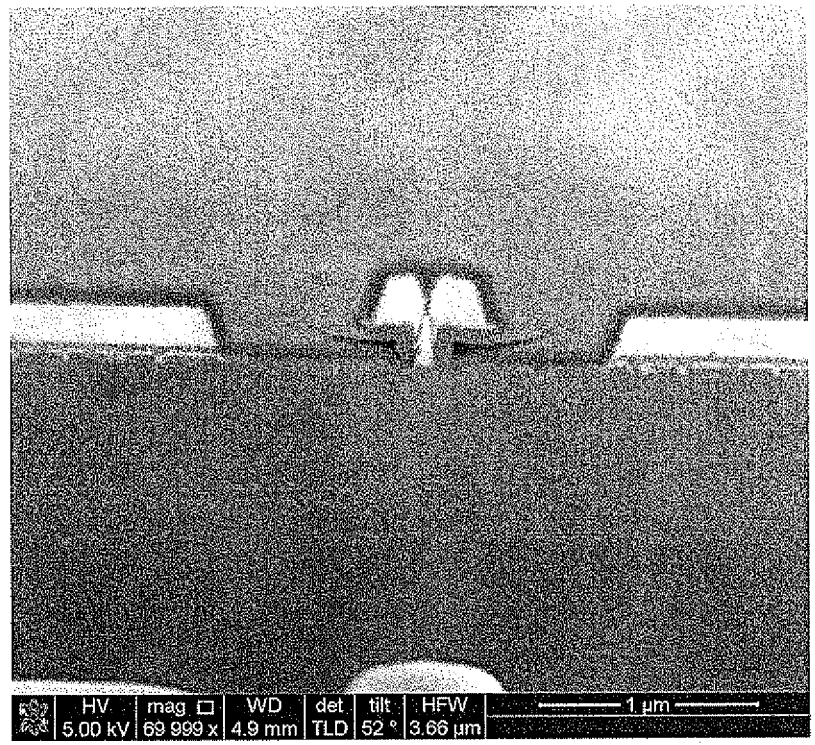
FIG. 4A to FIG. 4B are SEM images showing the gate structure according to the present invention.
Figure 4B:

Please refer to FIG. 3 in conjunction with FIG. 4A to FIG. 4B. FIG. 3 is a schematic view showing a HEMT structure with a gate structure according to the present invention, FIG. 4A to FIG. 4B are SEM images showing the gate structure according to the present invention.

As shown in FIG. 3, the HEMT according to a preferred embodiment comprises a substrate, a InAlAs buffer layer, a $In_{0.7}Ga_{0.3}/InAs/In_{0.7}Ga_{0.3}As$ channel layer, a InAlAs space layer, a InAlAs barrier layer, a InP etching stop layer, a cap layer and an ohmic contact formed from bottom to top. However, the structure and the components are not limited to the above embodiment.

Preferably, a wide variety of substrates may be used in the present invention. Suitable substrates are those used in the manufacture of electronic devices. Exemplary substrates include, without limitation, gallium arsenide ("GaAs"), silicon ("Si"), indium gallium arsenide ("InGaAs"), aluminum gallium arsenide ("AlGaAs"), strained silicon, silicon germanium ("SiGe"), and mixtures thereof. Other suitable substrates are well known to those skilled in the art. For example, the substrate may include an InGaAs/AlGaAs/GaAs film stack grown on a semi-insulating GaAs substrate. Such films may be grown by a variety of means, such as by molecular beam epitaxy ("MBE"), metalorganic chemical vapor deposition ("MOCVD"), physical vapor deposition ("PVD"), liquid phase epitaxy ("LPE"), chemical beam epitaxy ("CBE") and atomic layer deposition ("ALD"). These film growth techniques are well known to those skilled in the art. The substrates may include one or more additional layers of materials. The choice of such substrates will depend upon the particular electronic device desired and is well within the ability of those skilled in the art. More preferably, the substrate used herein is a gallium arsenide (GaAs) substrate or an indium phosphorous (InP) substrate.

In the following, the fabricating process will be further described. However, in addition to the features such as the thin channel layer and the gate structure, the structure shown in FIG. 3 is a conventional structure, and therefore, it will not be described in detail herein.

Firstly, the epitaxial layer structure of the InAs thin-channel device was grown by MBE on a 3-in. InP substrate, as shown in FIG. 3. The structure consisted of a 600-nm-thick $In_{0.52}$—$Al_{0.48}As$ buffer, a thin 2 nm pure InAs layer with 1 nm $In_{0.7}Ga_{0.3}As$ upper sub-channel and 2 nm $In_{0.7}Ga_{0.3}As$ lower subchannel, a 3-nm-thick InAlAs spacer, a Si δ-doping with $5 \times 10^{12}$ $cm^{-2}$, a 2-nm-thick InAlAs barrier, and a 3-nm thick InP etching stop. For the multilayer cap structure, 15-nm n+-$In_{0.52}Al_{0.48}As$ ($2 \times 10^{18}$ $cm^{-2}$), 15-nm n+-$In_{0.53}$—$Ga_{0.47}As$ ($2 \times 10^{19}$ $gcm^{-2}$), and 4-nm n+-$In_{0.65}Ga_{0.35}As$ ($2 \times 10^{19}$ $cm^{-2}$) layers were used from bottom to top to reduce the potential barrier across the undoped Schottky barrier, parasitic source/drain resistances, and contact resistance and to assist the electron tunneling under ohmic contact in such ultrahigh-speed HEMTs. After removing the cap layer, the measured room-temperature two-dimensional electron gas (2DEG) density and electron mobility were $3.02 \times 10^{12}/cm^2$ and 11,100 $cm^2 V^{-1} s^{-1}$, respectively. For the device fabrication, mesa isolation was conducted using a wet chemical phosphoric-based solution. A mesa sidewall was also obtained by using the mixture solution of succinic acid, $H_2O_2$ and $NH_4OH$. After surface pretreatment with the diluted HCl solution for 60 s, a 1.83 μm ohmic contact spacing between source and drain electrodes was formed by using nonalloyed Au/Ge/Ni/Au (20/40/14/220 nm). The low ohmic contact resistance of 0.018 Ωmm (with cap) and the channel sheet resistance of 119Ω/□ (without cap) were attained by TLM.

Subsequently, the recess engineering was performed carefully as the following. Firstly, a layer of a first photoresist is formed on the abovementioned substrate which has the above layers formed thereon. In general, the step of forming the layer of the first photoresist can be performed by any proper method, such as a spin coating process, a roller coating process, a curtain coating process, a dipping process, and a spraying process. Preferably, the spin coating process is conventionally used. More preferably, the step of forming the layer of the first photoresist is performed by reducing a reducing a rotation rate of the spin coating process to thicken the thickness of the layer of the first photoresist.

And then, a layer of a second photoresist and a layer of a third photoresist are formed in order on the layer of the first photoresist. As to the step of forming the layer of the second photoresist and the layer of the third photoresist, it can adopt any conventional method without limitation.

Figure 1:
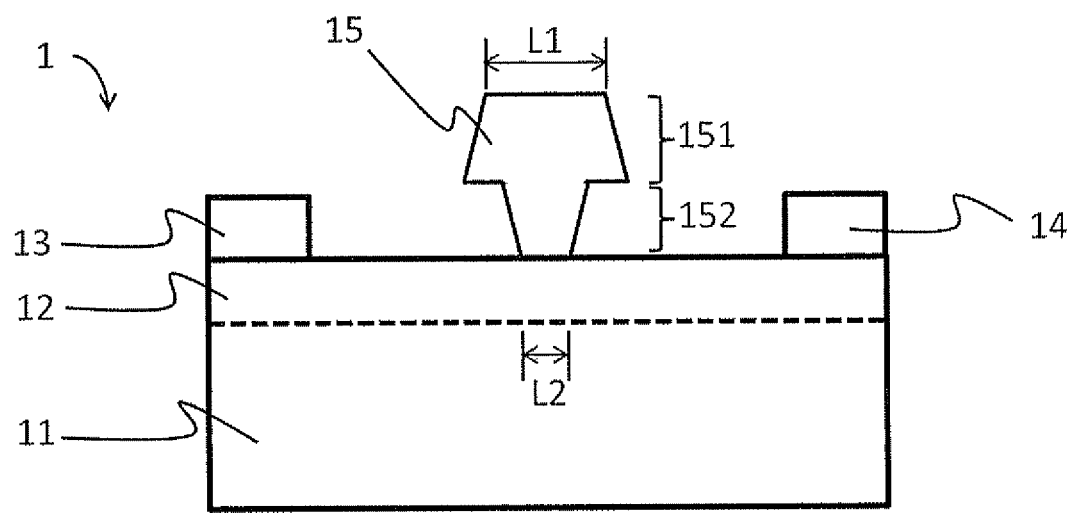
FIG. 1 is a simplified schematic diagram of a high electron mobility transistor (HEMT) in the prior art.
Figure 2A:
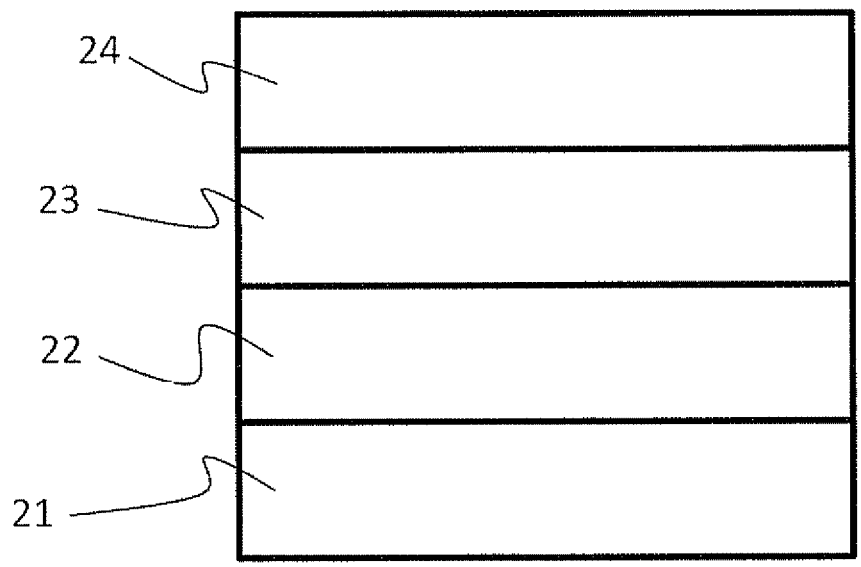
FIG. 2A, FIG. 2B, FIG. 2C to FIG. 2D are diagrams showing a conventional process for forming a gate structure using e-beam.
Figure 2B:
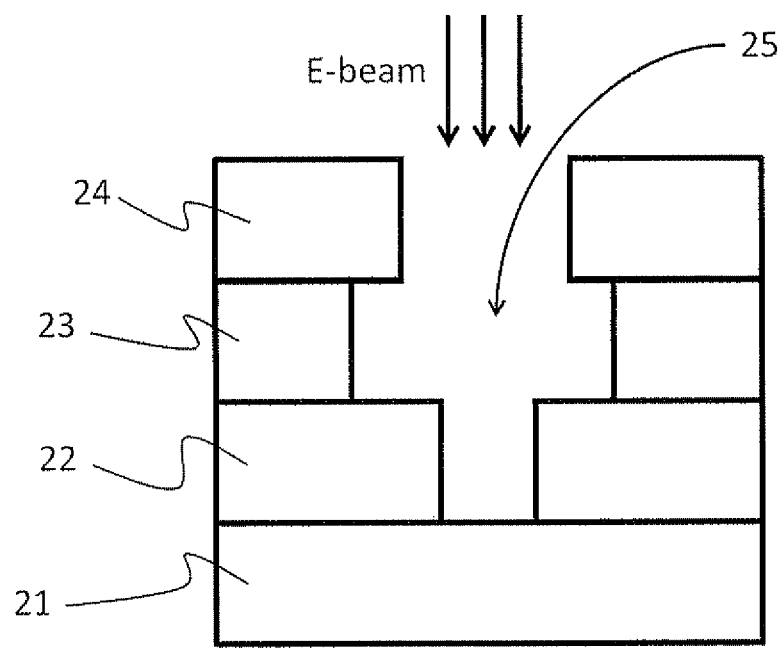
Figure 2C:
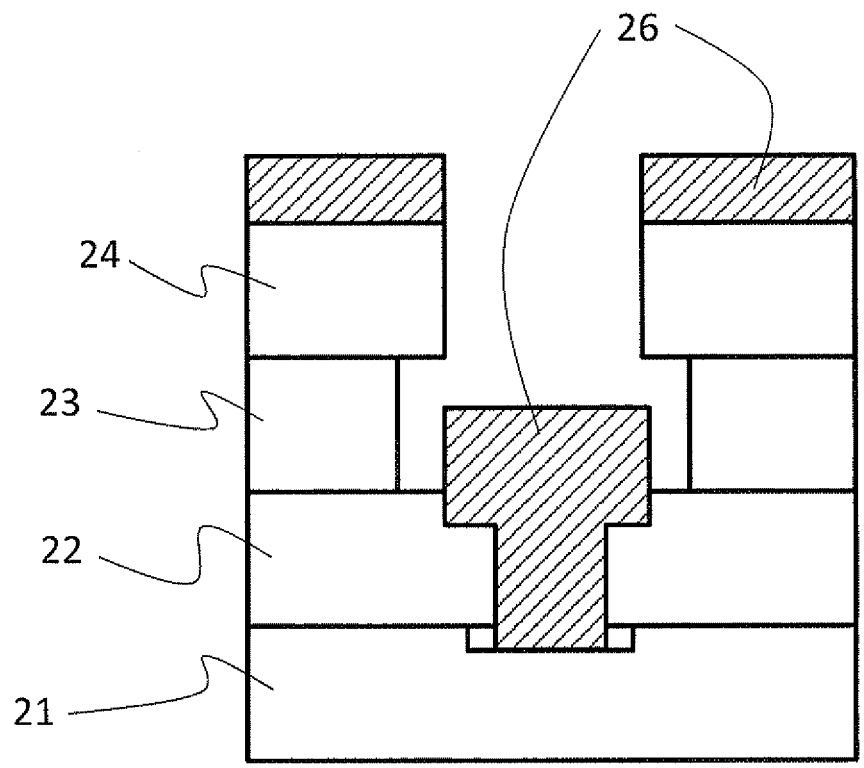
Figure 2D:
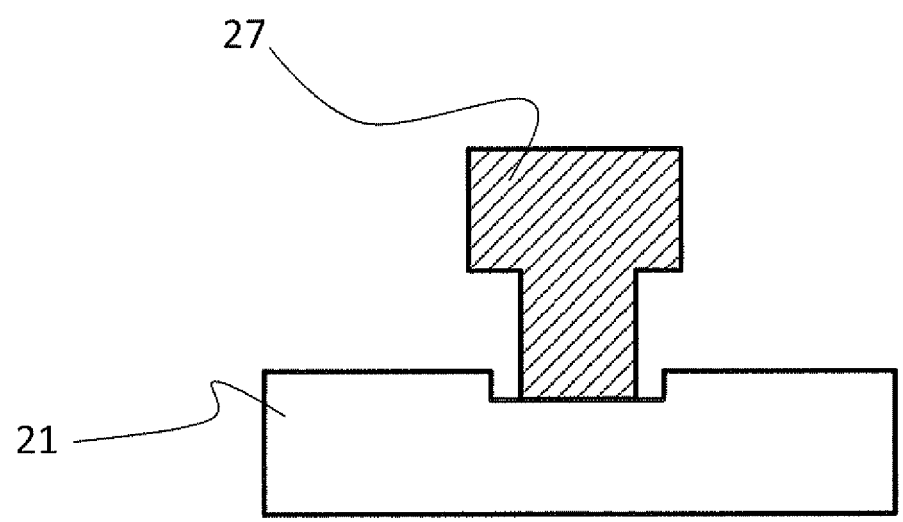

The layer of the first photoresist, the layer of the second photoresist and the layer of the third photoresist are patterned to form a recess. Preferably, the above step is performed by an electron-beam lithography method, and the recess is a T-shaped recess as shown in FIG. 2B. More preferably, a citric acid/hydrogen peroxide mixture can be used to etch the multilayer cap and controlling the side-recess length precisely, but the present invention is not limited thereto.

After a step of depositing a conductive material in the recess and a step of removing the layer of the first photoresist, the layer of the second photoresist and the layer of the third photoresist, a 60 nm T-shaped gate is formed as shown in FIG. 3. Preferably, the T-shaped gate is formed with a Pt (4 nm)/Ti (20 nm)/Pt (20 nm)/Au (250 nm) metal stack, but the present invention is not limited thereto. Although it is not shown in the figure, 100-nm-thick SiNx is then deposited thereon as a passivation layer using PECVD at 250° C. for 1 h, which also caused the Pt front contact to react with the InP stop layer and $In_{0.52}Al_{0.48}As$ barrier layer, in other words, forming a Pt-buried gate.

By FIGS. 4A and 4B, which are SEM images showing the gate structure according to the present invention, it can be measured that the T-gate has a gate length defined as $L_g$ of 60 nm and a stem height defined as $L_s$ of 250 nm. In addition, the Pt fully diffused into the Schottky barrier and improved the gate stability during passivation. The gate-to-channel distance was estimated at approximately 4 nm and the lateral recess length, which is a distance from the T-gate to the sidewall of the recess, is approximately 70 nm. Compared to the conventional T-shaped gate structure, $L_s$ of the T-shaped gate structure of the present invention is higher and it will minimize the parasitic as the following Table 1:

|  | high stem gate (>250 nm) | high stem gate (~100 nm) |
|---|---|---|
| Rs + Rd | 0.3 Ω-mm | 0.83 Ω-mm |
| Total Delay | 210 fs | 236.6 fs |
| Parasitic Delay | 38 fs | 53.9 fs |

In addition, as shown in FIG. 3, the thicknesses of both the channel and InAlAs barrier layer were reduced to 5 nm. A thin InAlAs barrier layer is typically preferable for reducing the resistance across the Schottky barrier InAlAs/InAs heterostructure and achieving a high transconductance. Furthermore, the fabrication process was simplified through the growth of a thin barrier layer and Pt-buried gate during passivation to maintain an optimal channel aspect ratio compared with the two-step recess technique. The fabricated devices having a T-shaped gate structure described as above has been demonstrate excellent DC and RF characteristics that benefited from the reduction of parasitic resistance/capacitance and improvement of the channel aspect ratio and output conductance.

Figure 5A:
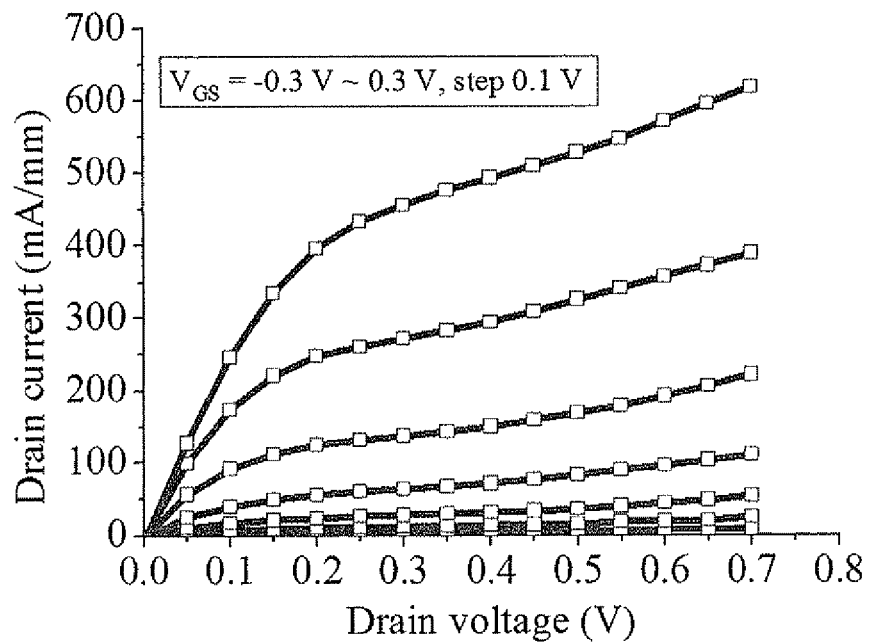
FIG. 5A is a diagram showing drain-source current versus drain-source voltage curve for 60 nm device.
Figure 5B:
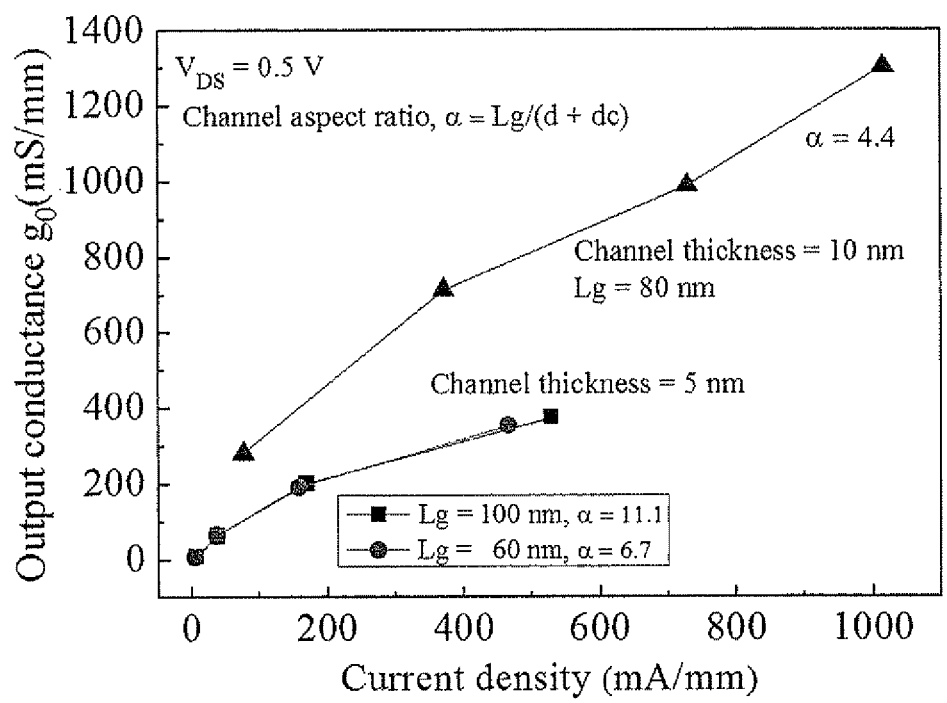
FIG. 5B is a diagram showing output conductance as a function of drain current for various channel thickness.

Please refer to FIG. 5A to Figure 5B. FIG. 5A is a diagram showing the measured DC current-voltage characteristics of 60 nm gate InAs thin-channel HEMTs with 2×20 μm² gate width. A favorable saturation with excellent pinch-off behaviors is observed in the diagram. The on resistance $R_{ON}$ was calculated at approximately 0.49 Ωmm at a $V_{GS}$ of 0.3V for the $L_g$=60 nm D-mode HEMTs. Smaller output conductance values were obtained compared with the device structure in a previous study, in which a thicker channel and a thicker InAlAs barrier layer were used. The dependence of the output conductance ($g_o$) on the aspect ratio α (defined as the gate length divided by the total thickness of the channel and barrier layer) is plotted in FIG. 5B for various gate lengths of 60 nm, 80 nm, and 100 nm. It is know that a higher α yields a lower $g_o$ value, which implies that scaling of only the gate length is not sufficient for the reduction of the output conductance.

Figure 6:
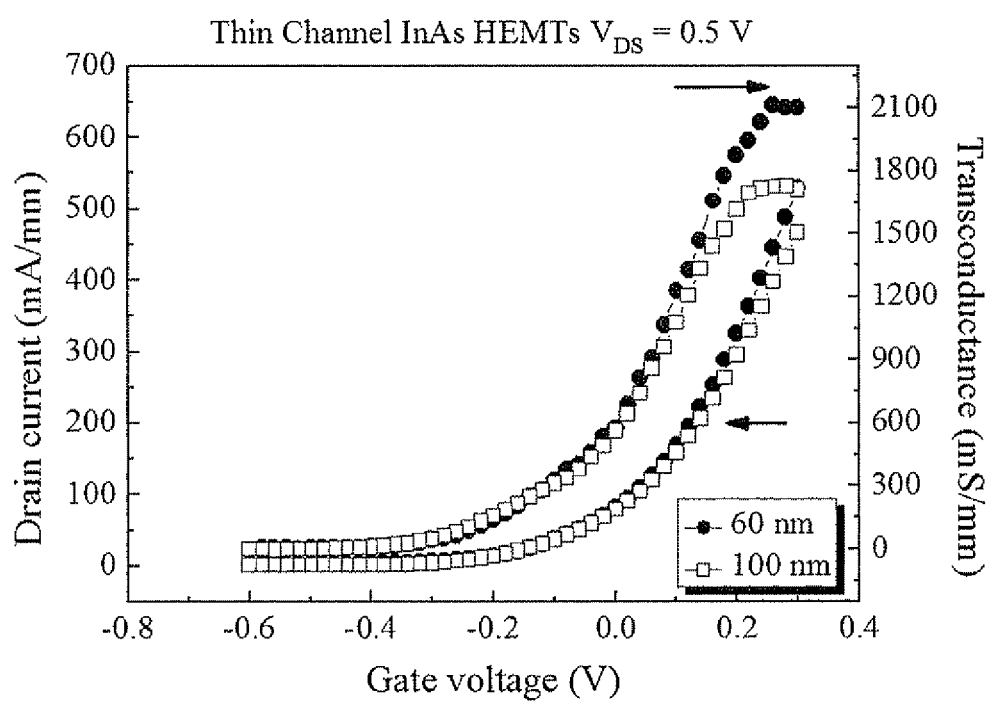
FIG. 6 is a diagram showing transconductance versus gate-source voltage with 60 nm and 100 nm gate length.

Moreover, the measured DC transconductance $g_m$ and drain current versus $V_{GS}$ with various $L_g$ values are shown in FIG. 6. An increase of peak gm value from 1726 to 2114 mS/mm was observed as the $L_g$ was scaled down from 100 to 60 nm. The short gate-to-channel distance and the low source resistance (0.15 Ωmm) are the main reasons for such high $g_m$ due to the improvement of carrier transport properties.

Figure 7A:
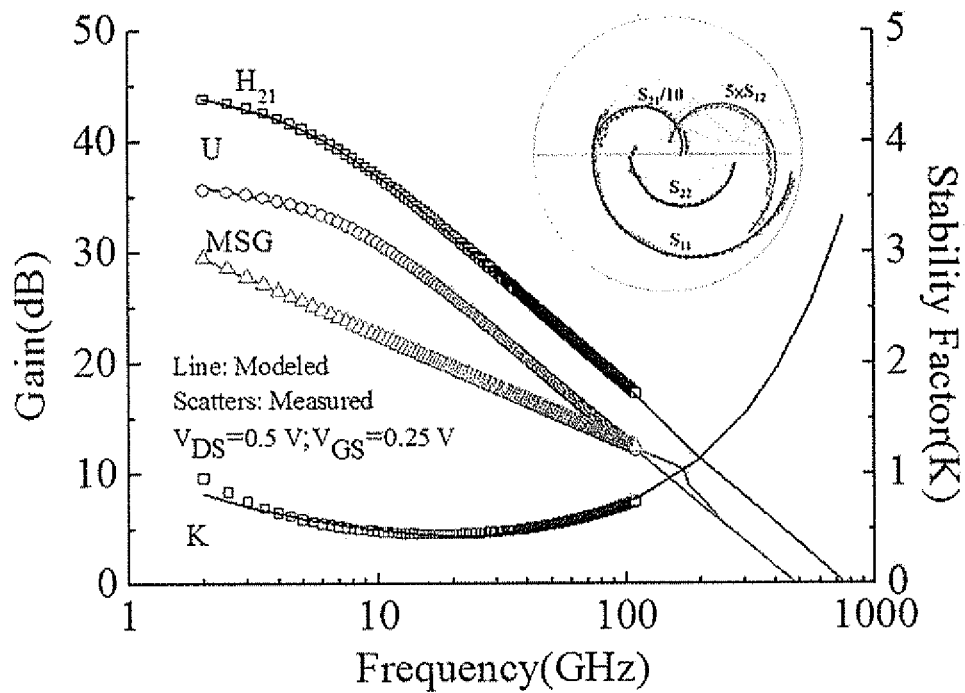
FIG. 7A is a diagram showing frequency dependence of the current gain ($H_{21}$), Mason's unilateral gain (U), maximum stable gain (MSG), and stability factor (K) at $V_{DS}$=0.5V and $V_{GS}$=0.25 V.

The RF performance was characterized from 2 GHz to 110 GHz by using an HP 8510XF network analyzer with E7352 test heads calibrated by using a standard load-reflection-reflection-match method. The procedures of small-signal equivalent circuit modeling with the removal of the parasitic capacitances from the probing pads followed those in the prior art. The extracted parasitic capacitance at the gate-source end was 11.3fF and that at the drain-source end was 9.5fF. The de-embedded current gain ($H_{21}$), maximum stable gain (MSG), Mason's unilateral power gain (U), and stability factor (K) as functions of frequency at $V_{DS}$=0.5V and $V_{GS}$=0.25V are plotted in FIG. 7A. The predictions of the equivalent circuit model are also included in the same figure. The fT and fmax were extracted by extrapolating $H_{21}$ and U with a −20 dB/decade slope to be 710 GHz and 478 GHz, respectively. Measurement on multiple devices using different test systems was performed for verification purposes.

Figure 7B:
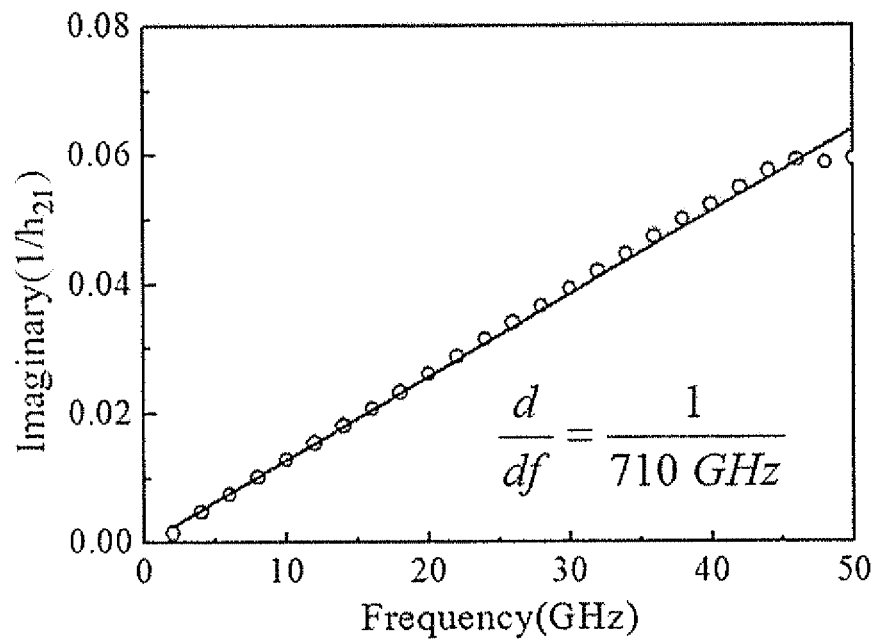
FIG. 7B is a slope of the imaginary component of the reciprocal of the current gain versus frequency, taken from the low frequency portion of the measurement range.

To avoid the ambiguity during the extrapolation procedure, Equation (5) in the disclosure published by H. K. Gummel in Proc. IEEE 57 (1969) 2159 is applied to determine fr. The slope of the imaginary component of the reciprocal of the current gain versus frequency, taken from the low-frequency portion of the measurement range, was plotted in FIG. 7B. And further, Equation (3) in the disclosure published by M. B. Das in IEEE Trans. Electron Devices 32 (1985) 11 is applied for $f_{max}$. Both of these equations yielded good consistency. The large difference in $f_T$ and $f_{max}$ for the device was mainly because of the narrow-side recess length ($L_{side}$). The small $L_{side}$ concentrates the applied drain voltage in this short recess region to increase the lateral electric field under the gate electrode, which boosts the electron velocity and causes the high $f_T$. A possible tradeoff between current gain and power gain can be made depending on the applications. Therefore, it is clear that the superior performance is attributed to the successful combination of high electron mobility of InAs, low parasitic resistance and capacitance obtained using a high-gate-stem structure, and the optimal channel aspect ratio through the use of the thin channel and barrier layer.

To sum up, a device having the gate structure disclosed in the present invention, such as 60 nm InAs thin-channel HEMTs with a stem height greater than 250 nm and 5-nm-thick barrier layer thickness described as above, is characterized for frequencies in the submillimeter-wave range. The device exhibited a considerably high $DC_{gm}$ of 2,114 mS/mm and a high $f_T$ of 710 GHz when biased at $V_{DS}$=0.5 V, indicating that the device is an excellent candidate for emerging submillimeter-wave applications. This high $f_T$ is attributable to the use of a thin InAs transistor channel, a thin InAlAs barrier layer, and a Pt-buried gate, which reduces the gate-to-channel distance to 4 nm, thus, improving the channel aspect ratio. In addition, the use of a multicap layer and a high gate stem decreases the source and gate resistances, as well as the overall capacitance of the device.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A T-shaped gate structure applied for an electronic component, comprising:
   a substrate, the substrate is selected from the group consisting of a gallium arsenide (GaAs) substrate and an indium phosphorous (InP) substrate;
   an active region defined thereon; and
   a T-shaped gate structure is disposed in the active region, and the T-shaped gate having a stem with a height of 250 nm, the T-shaped gate structure has a gate length of 60 nm, a distance between the stem and a sidewall of a recess is 70 nm.

2. The T-shaped gate structure according to claim 1, wherein the gate structure is formed by the following steps, comprising;
   forming and thickening a layer of a first photoresist on the substrate, wherein the step of forming and thickening the layer of the first photoresist is performed by reducing a rotation rate of a spin coating process;
   forming a layer of a second photoresist and a layer of a third photoresist in order on the layer of the first photoresist;
   patterning the layer of the first photoresist, the layer of the second photoresist and the layer of the third photoresist to form a recess;
   depositing a conductive material in the recess; and
   removing the layer of the first photoresist, the layer of the second photoresist and the layer of the third photoresist, wherein the step of patterning the layer of the first photoresist, the layer of the second photoresist and the layer of the third photoresist to form a recess is performed by an electron-beam lithography method.

* * * * *